(12) United States Patent
Ozumi

(10) Patent No.: US 6,600,513 B1
(45) Date of Patent: Jul. 29, 2003

(54) CHARGE TRANSFER DEVICE

(75) Inventor: Takehiko Ozumi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/240,138

(22) Filed: Jan. 29, 1999

(30) Foreign Application Priority Data

Jan. 30, 1998 (JP) .......................................... 10-020011

(51) Int. Cl.$^7$ .......................... H04N 3/14; H04N 5/335
(52) U.S. Cl. ........................ 348/311; 327/142; 327/91; 257/239; 250/208.1; 377/60
(58) Field of Search ................... 348/311, 321, 348/323; 327/142, 91; 257/239; 250/208.1; 377/60

(56) References Cited

U.S. PATENT DOCUMENTS

| | | | | |
|---|---|---|---|---|
| 5,214,683 A | * | 5/1993 | Kimura | 377/60 |
| 5,276,723 A | * | 1/1994 | Miwada | 377/60 |
| 5,436,949 A | * | 7/1995 | Hasegawa et al. | 377/60 |
| 5,767,902 A | * | 6/1998 | Koyama | 348/294 |
| 5,907,357 A | * | 5/1999 | Maki | 348/312 |
| 5,966,172 A | * | 10/1999 | Tsunai | 348/241 |
| 6,031,571 A | * | 2/2000 | Arakawa | 348/316 |
| 6,150,682 A | * | 11/2000 | Sawada et al. | 257/290 |
| 2001/0050714 A1 | * | 12/2001 | Haraguchi | 348/302 |
| 2002/0024069 A1 | * | 2/2002 | Tsunai | 257/239 |

FOREIGN PATENT DOCUMENTS

| | | |
|---|---|---|
| JP | 4-360544 | 12/1992 |
| JP | 6-133227 | 5/1994 |
| JP | 9-130681 | 5/1997 |

* cited by examiner

*Primary Examiner*—Vincent Boccio
*Assistant Examiner*—Eric Wisdahl
(74) *Attorney, Agent, or Firm*—Edwards & Angell; David G. Conlin

(57) ABSTRACT

A charge transfer device of the present invention includes: a floating diffusion amplifier type charge detecting portion containing a reset gate and a reset drain; and a source follower circuit including a detecting transistor having substantially the same potential profile as a potential profile of the reset gate of the charge detecting portion and a load transistor connected to the detecting transistor, wherein an output from the source follower circuit is supplied to the reset drain of the charge detecting portion, a first voltage, which is generated by resistance-dividing a power-supply voltage to be supplied to a drain of the source follower circuit, is commonly applied to each gate of the detecting transistor and the load transistor, a second voltage, which is generated by resistance-dividing the power-supply voltage, is applied to the reset gate of the charge detecting portion via a clamp circuit, whereby the charge transfer device is controlled in such a manner that a reset operation is always performed in an optimum state, irrespective of a variation in a potential under the reset gate.

3 Claims, 15 Drawing Sheets

CHARGE TRANSFER DEVICE

BACKGROUND OF THE INVENTION

1. Field of the Invention

The present invention relates to a charge transfer device (CTD) having a charge detecting portion of a floating diffusion amplifier type (hereinafter, referred to as "FDA type") preferable for an image sensor, a delay device, etc. More specifically, the present invention relates to a charge transfer device which is capable of decreasing a reset gate voltage in a charge voltage converting portion of a signal charge, realizing non-adjustment of a reset gate voltage, and thereby reducing the number of components in a system and power consumption.

2. Description of the Related Art

As a representative device using a CTD such as a charge coupled device (CCD), a two-dimensional image sensor shown in FIG. 7, a delay device of a serial-parallel-serial (SPS) system shown in FIG. 8, and the like are well-known.

In the two-dimensional image sensor shown in FIG. 7, a signal charge photoelectrically converted by photoelectric conversion elements 2 arranged in a matrix is transferred to a signal output portion 12 via a vertical transfer channel 6 and a horizontal transfer channel 8. The transferred signal charge is charge-voltage converted at the signal output portion 12 and given to an amplifier (MOS amplifier) 14. When the amplifier 14 is operated, an output signal is taken out. Thereafter, when a reset transistor (not shown) is operated, the signal output portion 12 is reset to a reference level $V_{RD}$ (power-supply voltage). Reference numeral 4 denotes a transfer gate.

In the delay device shown in FIG. 8, a signal charge given to a signal input portion 16 from an input terminal is transferred to a signal output portion 12 via a horizontal transfer channel 18, a vertical transfer channel 6, and a horizontal transfer channel 8. Thereafter, an operation similar to that of the image sensor shown in FIG. 7 is operated.

An example of a charge transfer device includes one which is provided with an FDA type charge detecting portion. FIG. 9 shows a representative structural example of an FDA type charge detecting portion. This charge detecting portion includes a reset drain (RD) 22, a reset gate (RG) 20, an output gate (OG), a horizontal transfer gate 8 consisting of H1, H2, . . . , a floating diffusion (FD), and an amplifier (MOS amplifier) 14. The reset drain 22 and the floating diffusion (FD) are a N⁺ region formed in a p-type semiconductor substrate. The floating diffusion (FD) and the p-type semiconductor substrate are collectively referred to as a floating diode 24.

FIG. 10 shows a drive timing of the charge detecting portion. FIG. 11 is a diagram showing a potential relationship between the time and the potential. FIG. 12 shows ($V_G$-$\Phi_{max}$) characteristics.

Herein, $V\Phi_{RLow}$ and $V\Phi_{RHigh}$ represent a "Low" level and a "High" level of a reset pulse applied to the reset gate 20, as shown in FIG. 10. $\Delta V_{max}$ in FIG. 11 represents the maximum signal amplitude that can be handled by the floating diode 24.

Assuming that a potential under the reset gate 20 is $\Phi_{max}$ ($V_G$[V]) and a voltage applied to the reset drain 22 is $V_{RD}$, $\Delta V_{max}$ is represented by the following Expression (1):

$$\Delta V_{max} = V_{RD} - \Phi_{max}(V\Phi_{RLow}) - \Delta V_F \quad (1)$$

wherein $\Delta V_F$ represents a field-through component of a signal output.

From the above expression, in order to perform a reset operation of the reset gate 20, the following Expression (2) should be satisfied.

$$\Phi_{max}(V\Phi_{RHigh}) - V_{RD} \geq 0 \quad (2)$$

Furthermore, in the case where a reset gate pulse at a predetermined level is applied to the reset gate 20 from outside (outside of a device), when $\Phi_{max}$ and the voltage $V_{RD}$ applied to the reset drain 22 are under a predetermined condition, an amplitude and a level of a required reset gate pulse are, for example, as follows: in the case of $V_{RD}$=15.0 V, $\Phi_{max}(V_G$=0 V)=8.9 V, $\Delta\Phi_{max}/\Delta V_G$=0.8, and $\Delta V_F$=0.75 V, in order to satisfy $\Delta V_{max} \geq 1.2$ V, the following Expression (3) should be satisfied:

$$V\Phi_{RLow} \leq 5.1\ V \quad (3)$$

and in order to ensure a reset operation, the following Expression (4) should be satisfied:

$$V\Phi_{RHigh} \geq 7.6\ V \quad (4).$$

Thus, if an amplitude of a reset pulse is at least 2.5 V (=7.6 V–5.1 V), a reset operation can be ensured.

However, there are in actuality variations in a potential under the reset gate 20 and in a power-supply voltage used in such a system due to the variations in the production processes of a device. Therefore, it is required to set an amplitude and a level of a reset gate pulse so as to simultaneously ensure $\Delta V_{max}$ and a reset operation, considering each variation.

As an example, FIG. 13 shows ($V_G$-$\Phi_{max}$) characteristics of the reset gate 20 in the case where the variation of the potential $\Phi_{max}$ is ±0.7 V, and the variation of the voltage $V_{RD}$ to be applied to the reset drain 22 is ±0.5 V.

Under the conditions of $V_{RD}$=15.0±0.5 V, $\Phi_{max}(V_G$=0 V)=8.9±0.7 V, $\Delta\Phi_{max}/\Delta V_G$=0.8, and $\Delta V_F$=0.75 V, in order to satisfy $\Delta V_{max} \geq 1.2$ V, the following Expression (5) should be satisfied:

$$V\Phi_{RLow} \leq 3.6\ V \quad (5)$$

and in order to ensure a reset operation, the Expression (6) should be satisfied:

$$V\Phi_{RHigh} \geq 9.1\ V \quad (6)$$

Thus, an amplitude of a reset pulse should be at least 5.5 V (=9.1 V–3.6 V).

A variation of ±0.7 V of the potential $\Phi_{max}$ corresponds to a reset pulse width of 1.75 V, and a variation of ±0.5 V of the voltage $V_{RD}$ applied to the reset drain 22 corresponds to a reset pulse width of 1.25 V. Therefore, a reset pulse width is required to be 3.0 V (=1.75 V+1.25 V) plus 2.5 V (=7.6 V–5.1 V; in the case of no variations).

Recently, for example, in a two-dimensional image sensor, there is a demand for a decrease in the drive voltage and in the number of components, in addition to the demand for further miniaturization of a device and reductions in power consumption.

In the past, an output from a timing IC is amplified by an external circuit, offset, and input to a device as a pulse applied to a reset gate of an FDA type charge detecting portion. Due to the demand for a decrease in the drive voltage, a reduction in the number of components of a system, and a reduction in power consumption, driving of a reset gate with a voltage of 3.3 V, a decrease in the drive voltage, and non-adjustment of an offset voltage are in demand.

However, in a conventional system in which a reset gate pulse at a predetermined level is applied from the outside, an offset voltage of a reset pulse is required to be applied and adjusted by an external circuit. Furthermore, regarding decreases in voltage, it is required to consider the variation (+0.7 V in FIG. 13) of a potential under a reset gate and the variation (±0.5 V in FIG. 13) of a voltage applied to a reset drain due to the variations of a process. This involves difficulty in control, so that sufficient $V_{max}$ and a reset operation cannot be ensured.

In order to overcome these problems, there is a method for obtaining an optimum point of a reset operation in the course of a wafer test and writing the measured value into a write circuit provided in a device. However, according to this method, a wafer test and a method for writing a measured value become undesirably complicated.

Another method is described in Japanese Laid-Open Publication No. 6-133227. According to this method, as shown in FIG. 14, a control circuit including a detecting transistor 51 having the same potential profile as that of a reset gate 20 of an FDA type charge detecting portion A is provided in a device, and fluctuation in a reset operation point caused by the fluctuation in potential under the reset gate 20 is controlled by a detected value of a control circuit.

More specifically, a reset drain 22, a gate for detection, and a gate voltage for detection are used to reset a voltage of the reset drain 22.

However, according to this method, there are the following problems: (1) a pulse applied to the reset gate 20 is not varied in accordance with a voltage applied to the reset drain 22, so that the variation in each voltage should be considered; (2) a DC voltage applied to a gate of the detecting transistor 51 is not varied in accordance with a voltage applied to a drain of the detecting transistor 51, so that the variation in each voltage should be considered; and (3) a voltage of a floating diode 24 to be reset is affected by a voltage $V_{RD}$ of the reset drain 22; however, the voltage $V_{RD}$ of the reset drain 22 becomes unstable due to the induction of an external pulse and the heat emission of carriers.

Another method is described in Japanese Laid-Open Publication No. 4-360544. According to this method, as shown in FIG. 15, a detecting transistor 51 is combined with an inversion amplifier 56 in which a voltage gain is matched with an inverse number of a gradient of $\Phi_{max}$ vs. $V_G$ of a reset gate 20 of a charge detecting portion A, and an inverted voltage corresponding to a potential under the gate of the detecting transistor 51 is applied to the reset gate 20.

However, according to this method, an output of the detecting transistor 51 is directly input to the gate of the inversion amplifier 56. Therefore, the input signal to the charge detecting portion A includes unstable elements such as the induction of an external pulse and the heat emission of carriers. Furthermore, according to this method, the reset voltage is not corrected, so that the reset voltage may be unstable. Therefore, the above-mentioned problem will not be overcome by this method.

As described above, there are no conventional CTDs in which a satisfactory reset operation, a decrease in a reset gate voltage, and non-adjustment of a reset gate voltage are simultaneously achieved, whereby a reduction in the number of components in a system and a decrease in power consumption are realized.

SUMMARY OF THE INVENTION

A charge transfer device of the present invention includes: a floating diffusion amplifier type charge detecting portion containing a reset gate and a reset drain; and a source follower circuit including a detecting transistor having substantially the same potential profile as a potential profile of the reset gate of the charge detecting portion and a load transistor connected to the detecting transistor, wherein an output from the source follower circuit is supplied to the reset drain of the charge detecting portion, a first voltage, which is generated by resistance-dividing a power-supply voltage to be supplied to a drain of the source follower circuit, is commonly applied to each gate of the detecting transistor and the load transistor, a second voltage, which is generated by resistance-dividing the power-supply voltage, is applied to the reset gate of the charge detecting portion via a clamp circuit, whereby the charge transfer device is controlled in such a manner that a reset operation is always performed in an optimum state, irrespective of a variation in a potential under the reset gate.

A charge transfer device of the present invention includes a floating diffusion amplifier type charge detecting portion and a control circuit including a detecting transistor having substantially the same potential profile as a potential profile of a reset gate of the charge detecting portion provided in the device, the charge transfer device being controlled in such a manner that a reset operation is always performed in an optimum state, irrespective of a variation in a potential under the reset gate, wherein the control circuit comprises a source follower circuit including the detecting transistor and an inverter circuit having an input connected to an output of the source follower circuit, a power-supply voltage of the source follower circuit and the inverter circuit is connected to a reset drain of the charge detecting portion, and an output from the inverter circuit is applied to a reset gate of the charge detecting portion via a clamp circuit.

A charge transfer device of the present invention includes: a charge detecting portion including a floating diffusion, a reset gate and a reset drain; a control circuit including a source follower circuit and a resistance divider; and a pulse generating portion, wherein the source follower circuit includes a detecting transistor having substantially the same potential profile as a potential profile of the reset gate of the charge detecting portion and a load transistor connected between a source of the detecting transistor and a ground, and supplies its output to the reset gate together with a pulse generated by the pulse generating portion, and the resistance divider generates a first voltage and a second voltage by resistance-dividing a voltage supplied to a drain of the detecting transistor from a power source, supplies the first voltage commonly to gates of the detecting transistor and the load transistor, and supplies the second voltage to the reset gate.

In one embodiment of the present invention, the control circuit further includes a clamp circuit, and the second voltage is supplied to the reset gate from the resistance divider via the clamp circuit.

A charge transfer device of the present invention includes: a charge detecting portion including a floating diffusion, a reset gate and a reset drain; a control circuit including a source follower circuit and an inverter circuit; and a pulse generating circuit, wherein a voltage supplied from a power source to the reset drain is supplied to the source follower circuit and the inverter circuit as a power-supply voltage, the source follower circuit includes a detecting transistor having substantially the same potential profile as a potential profile of the reset gate of the charge detecting portion, and supplies its output to the inverter circuit, and the inverter circuit supplies a voltage obtained by inverting an output from the source follower circuit to the reset gate together with a pulse generated by the pulse generating portion.

In one embodiment of the present invention, the control circuit further includes a clamp circuit, and the inverted voltage is supplied from the inverter circuit to the reset gate via the clamp circuit.

Hereinafter, the function of the present invention will be described.

The CTD of the present invention includes a charge detecting portion having a floating diffusion, a reset gate, and a reset drain, and a control circuit having a source follower circuit and a resistance divider. The source follower circuit includes a detecting transistor having the same or substantially the same potential profile as that of the reset gate of the charge detecting portion and a load transistor connected between a source of the detecting transistor and a ground, and supplies its output to the reset gate. A resistance divider generates a first voltage and a second voltage by resistance-dividing a voltage supplied from a power source to a drain of the detecting transistor. The resistance divider supplies the first voltage commonly to gates of the detecting transistor and the load transistor, and supplies the second voltage to the reset gate. Therefore, a reset operation can be performed in an optimum state at all times irrespective of variations in a potential under the reset gate, and a satisfactory reset operation, a decrease in a reset gate voltage, and non-adjustment of an offset voltage can be simultaneously achieved. As a result, the number of components in a system and power consumption can be decreased.

Furthermore, if the control circuit further includes a clamp circuit, in which a current flows only in one direction, and the second voltage is supplied from the resistance divider to the reset gate via the clamp circuit, the number of components can be reduced.

Another charge transfer device of the present invention includes a charge detecting portion having a floating diffusion, a reset gate, and a reset drain, and a control circuit having a source follower circuit and an inverter circuit. A voltage supplied from a power source to the reset drain is supplied to the source follower circuit and the inverter circuit as a power-supply voltage. The source follower circuit includes a detecting transistor having the same or substantially the same potential profile as that of the reset gate of the charge detecting portion, and supplies its output to the inverter circuit. The inverter circuit supplies a voltage obtained by inverting the output from the source follower circuit to the reset gate. Therefore, a reset operation can be performed in an optimum state at all times irrespective of variations in a potential under the reset gate, and furthermore, an operation point of an amplifier is not varied.

Furthermore, if the control circuit further includes a clamp circuit, in which a current flows only in one direction, and the above-mentioned inverted voltage is supplied from the inverter circuit to the reset gate via the clamp circuit, the number of components can be reduced.

Thus, the invention described herein makes possible the advantage of providing a CTD in which a satisfactory reset operation, a decrease in a reset gate voltage, and non-adjustment of a reset gate voltage are simultaneously achieved, whereby a reduction in the number of components in a system and a decrease in power consumption are realized.

This and other advantages of the present invention will become apparent to those skilled in the art upon reading and understanding the following detailed description with reference to the accompanying figures.

DESCRIPTION OF THE PREFERRED EMBODIMENTS

Hereinafter, the CTD of the present invention will be described by way of illustrative embodiments with reference to the drawings.

Embodiment 1

Figure 1:
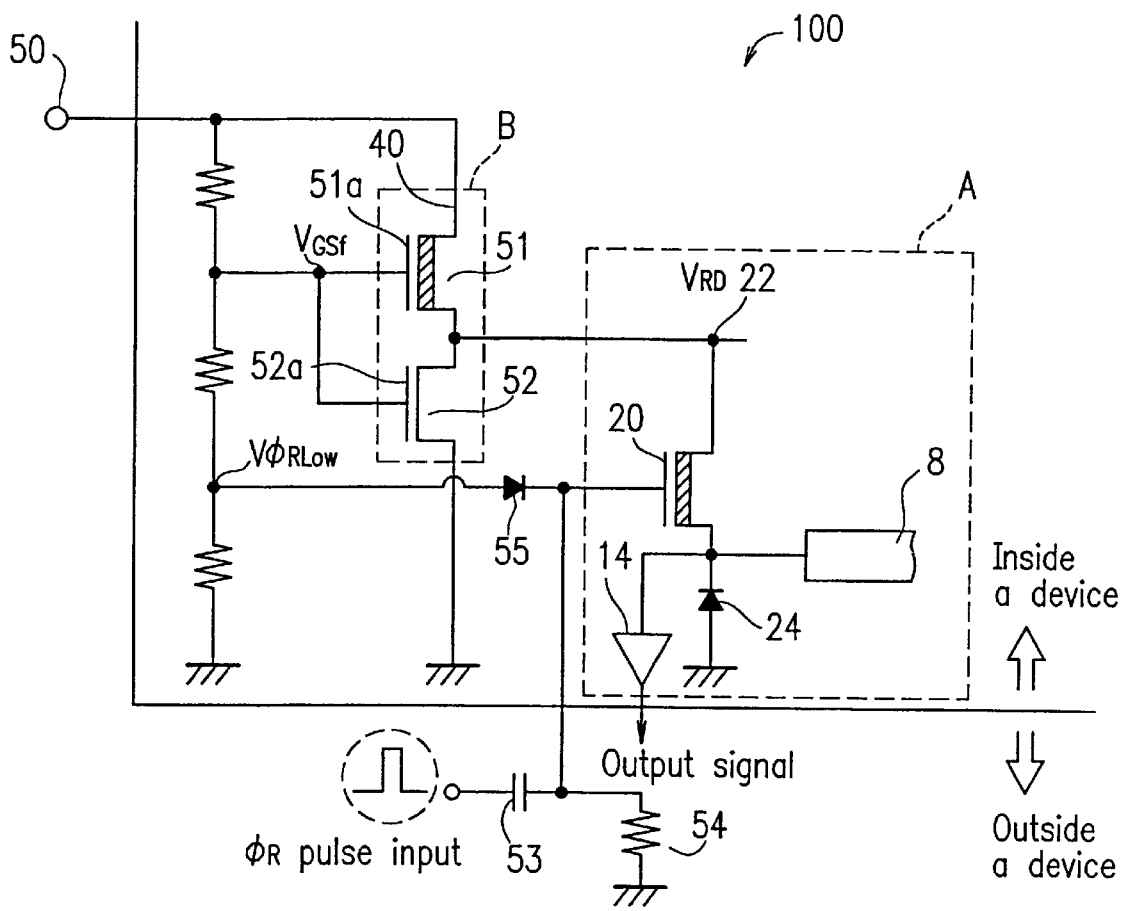
FIG. 1 is a circuit diagram showing a CTD in a first embodiment of the present invention.
Figure 2:
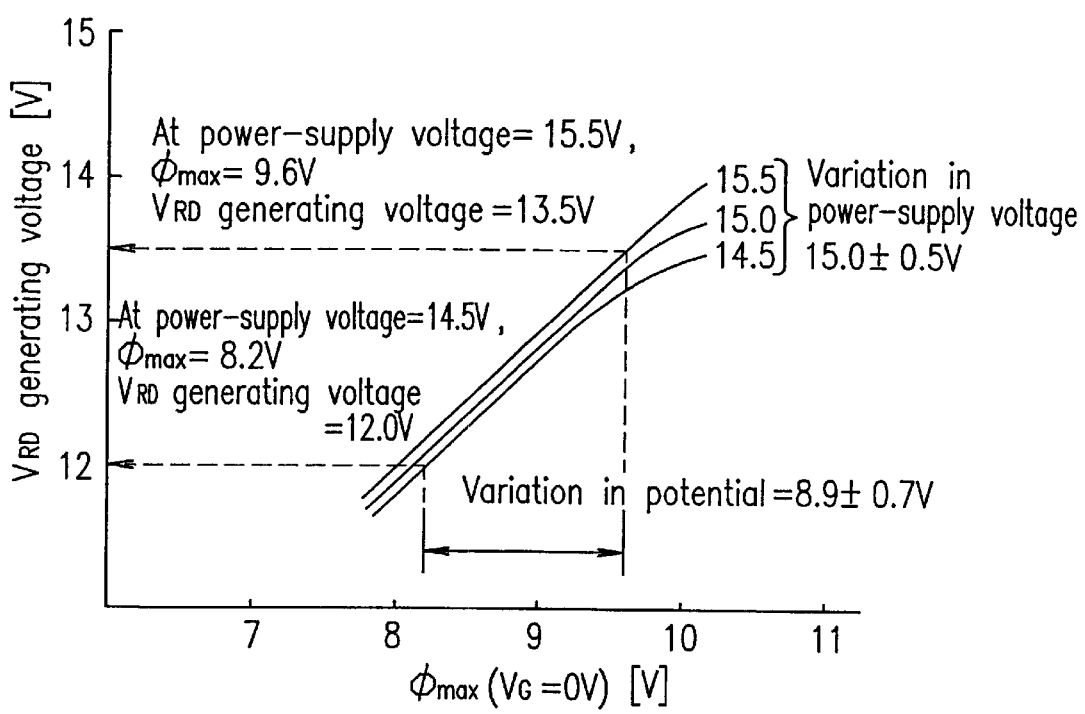
FIG. 2 is a graph showing the relationship between the $V_{RD}$ generating voltage and $\Phi_{max}$ ($V_G$=0 V) in the CTD in the first embodiment of the present invention.
Figure 3:
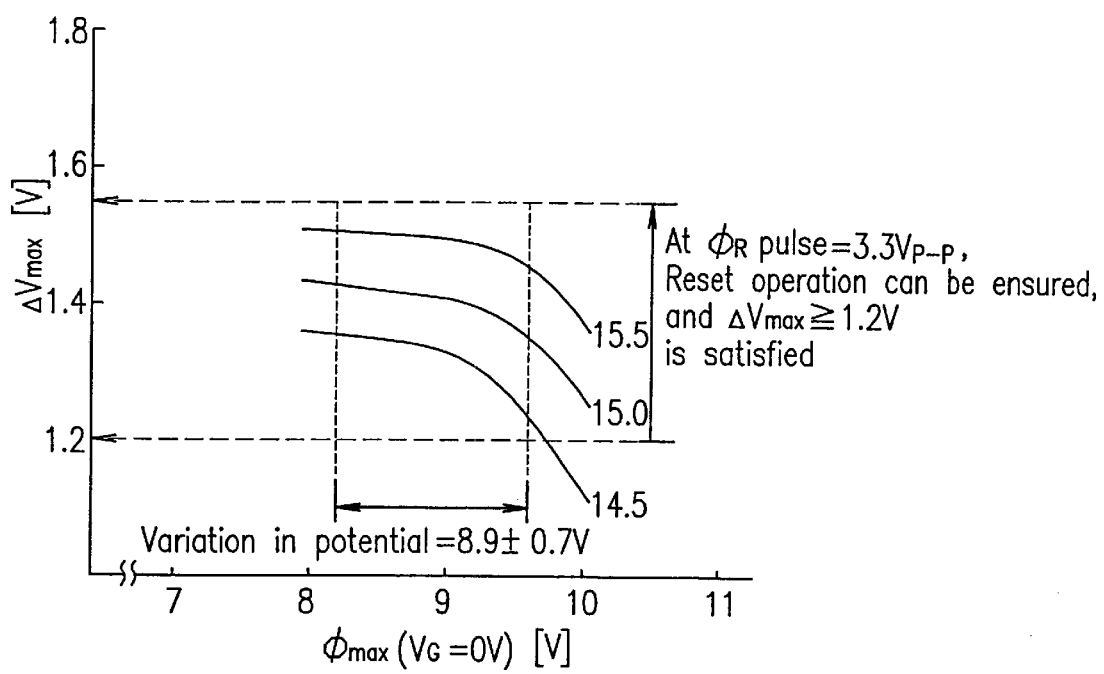
FIG. 3 is a graph showing an example of reset operation characteristics in the CTD in the first embodiment of the present invention.

FIGS. 1 to 3 show a CTD 100 in Embodiment 1 of the present invention. First, a circuit configuration of the CTD 100 in Embodiment 1 will be described with reference to FIG. 1.

The CTD 100 in Embodiment 1 includes an FDA type charge detecting portion A, and a source follower (SF) circuit B including a detecting transistor 51 having the same potential profile as that of a reset gate 20 of the charge detecting portion A and a load transistor 52 connected to the detecting transistor 51.

Figure 9:
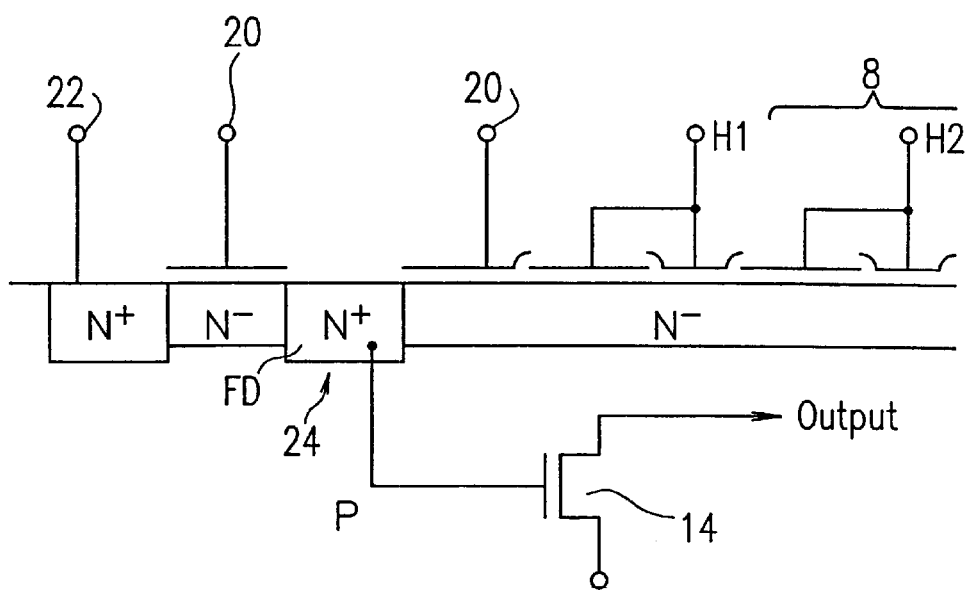
FIG. 9 is a cross-sectional view showing a representative structural example of an FDA type charge detecting portion.
Figure 10:
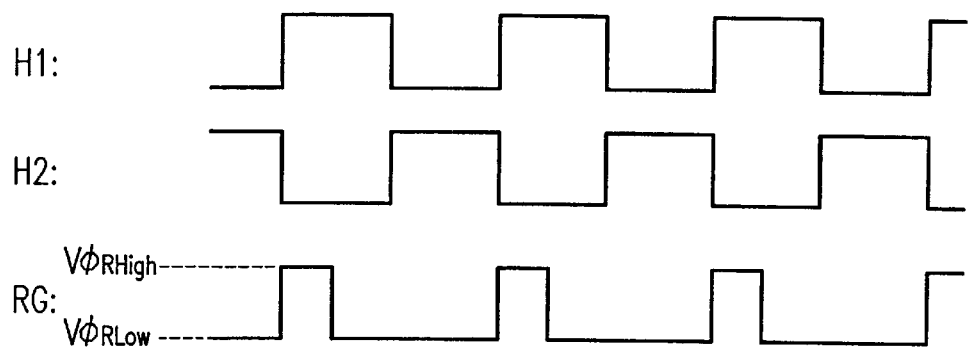
FIG. 10 is a waveform diagram showing a drive timing of the FDA type charge detecting portion shown in FIG. 9.
Figure 11:
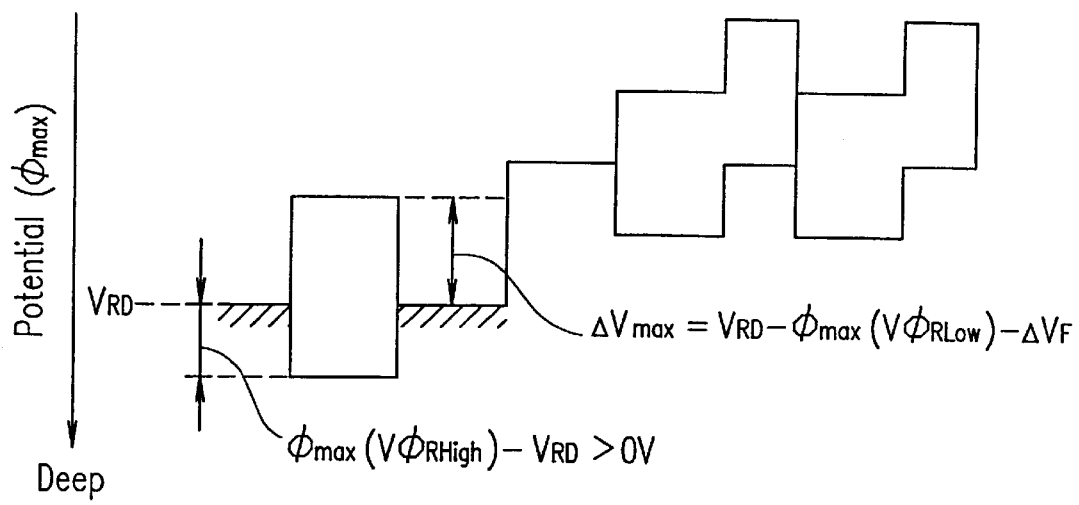
FIG. 11 is a potential diagram of the FDA type charge detecting portion shown in FIG. 9.
Figure 12:
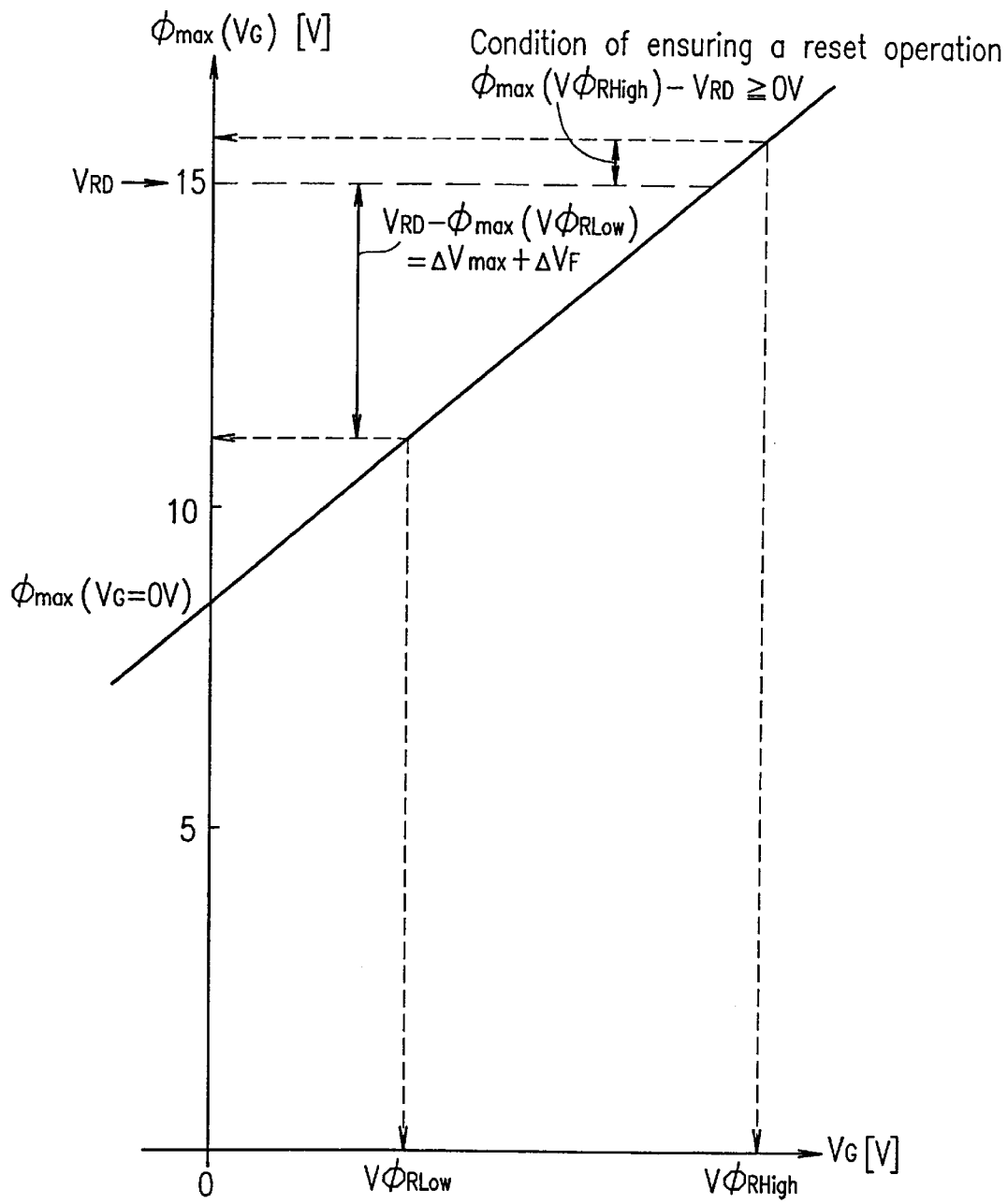
FIG. 12 is a graph showing representative ($V_G$-$\Phi_{max}$) characteristics of a reset gate in an FDA type charge detecting portion.
Figure 13:
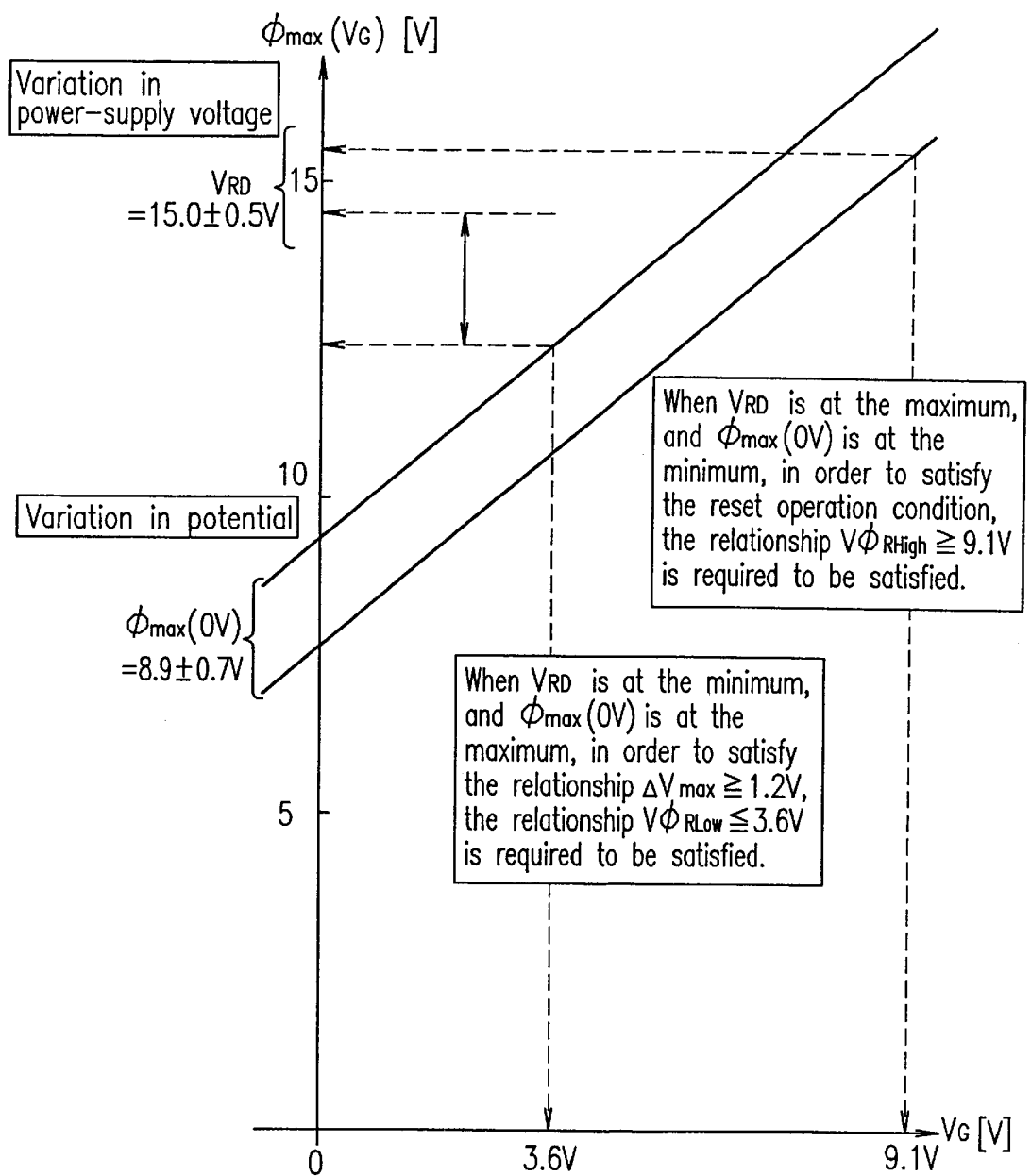
FIG. 13 is a graph showing ($V_G$-$\Phi_{max}$) characteristics of a reset gate in an FDA type charge detecting portion, including variations in a potential and in a power-supply voltage.
Figure 14:
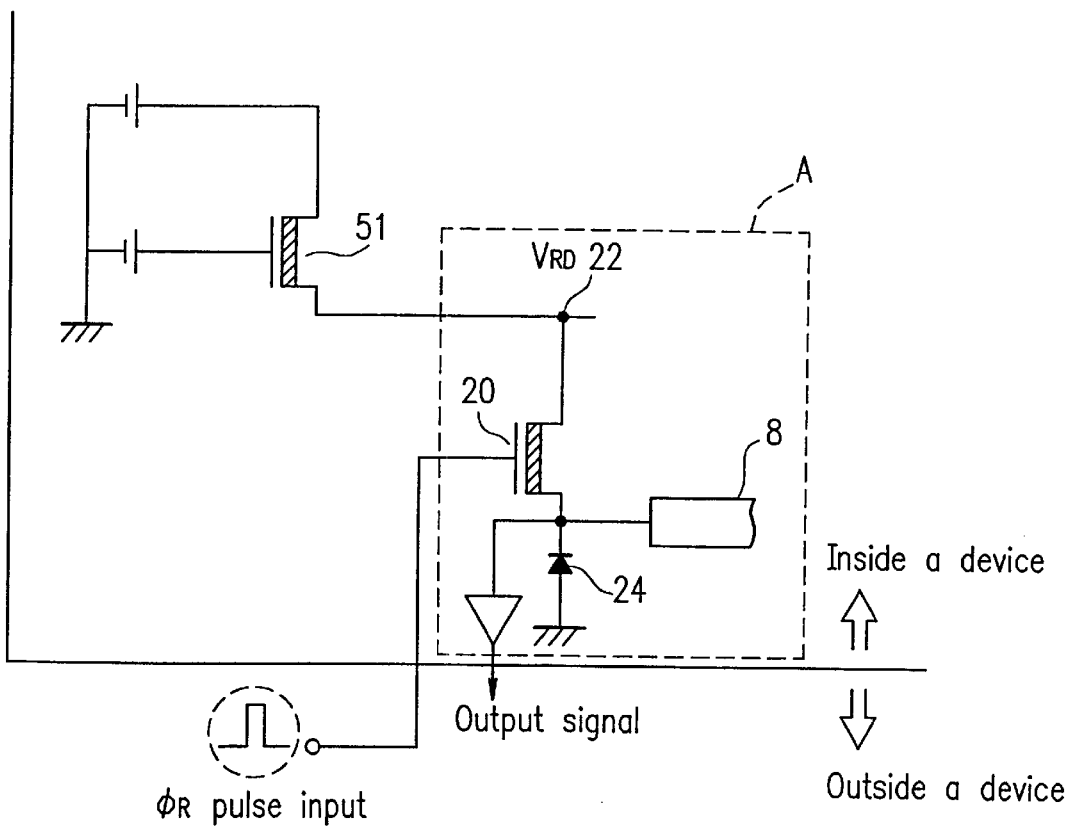
FIG. 14 is a circuit diagram showing a conventional CTD.
Figure 15:
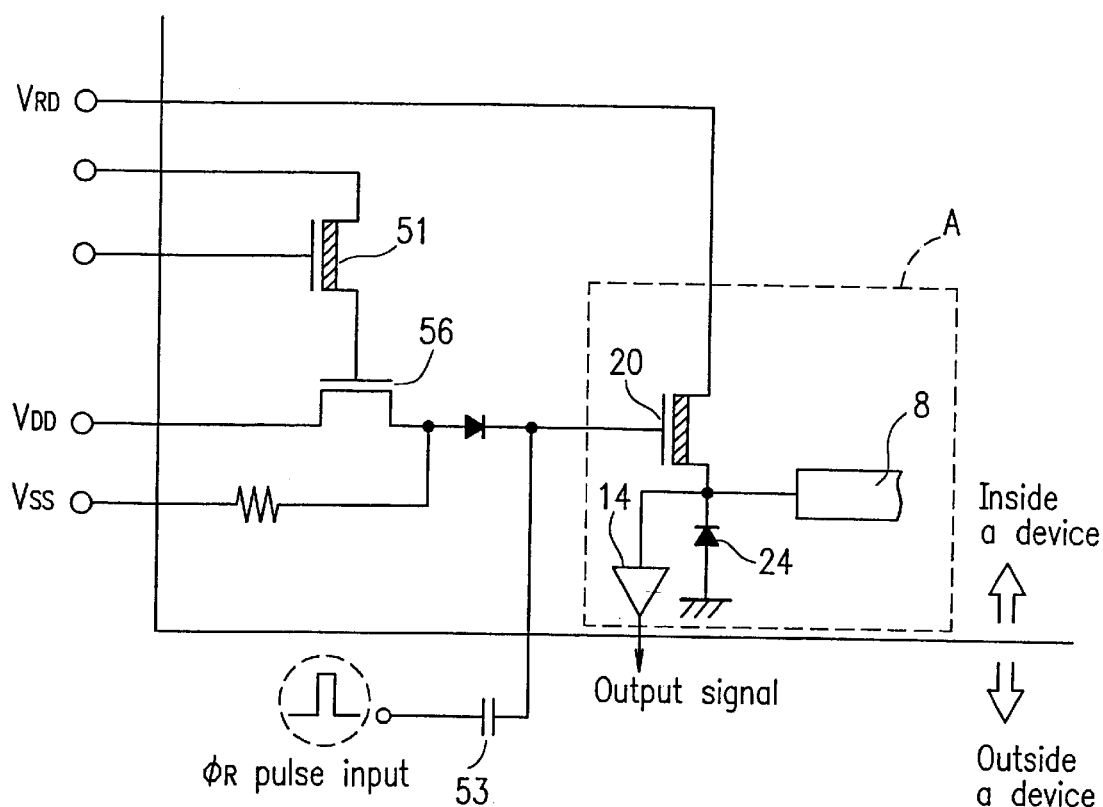
FIG. 15 is a circuit diagram showing another conventional CTD.

The FDA type charge detecting portion A is similar to that shown in FIG. 9.

A voltage is applied from a power source 50 to a drain 40 of the SF circuit 40. A predetermined voltage $V_{GSF}$ generated by resistance-dividing a voltage from the power source 50 is applied commonly to gates 51a and 52a of the detecting transistor 51 and the load transistor 52 included in the SF circuit B. An output from the SF circuit B is supplied to a reset drain 22 of the charge detecting portion A.

Another voltage $V\Phi_{RLow}$ generated by resistance-dividing a voltage from the power source 50 is applied to the reset gate 20 of the charge detecting portion A. In addition, a reset pulse $\Phi_R$ is applied to the reset gate 20 of the charge detecting portion A via an external capacitor 53 and an external resistor 54 provided outside the device. The predetermined voltage $V\Phi_{RLow}$ generated by resistance-dividing a voltage from the power source 50 common to the drain of the SF circuit B becomes an offset voltage of the reset pulse $\Phi_R$, and is applied to the reset gate 20. For example, assuming that the voltage $V\Phi_{RLow}$ is 1.5 V, the minimum value ($\Phi_{RLow}$) of the reset pulse $\Phi_R$ is 0 V, and the maximum value ($\Phi_{RHigh}$) thereof is 5 V, the reset gate 20 is supplied with a voltage of 1.5 V (=$V\Phi_{RLow}+\Phi_{RLow}$) and a voltage of 6.5 V (=$V\Phi_{RHigh}+\Phi_{RHigh}$), wherein the offset voltage is 1.5 V. The voltage $V\Phi_{RLow}$ may be applied to the reset gate 20 through a clamp circuit 55. If a clamp circuit in which a current flows only in one direction is provided, the number of components can be reduced. The reset pulse $\Phi_R$ can be generated by a pulse generating portion, for example, a pulse generating circuit, a pulse generator, or the like known to those skilled in the art.

In the above-mentioned circuit configuration, when a potential under the reset gate 20 is varied, an output from the SF circuit B is varied in accordance with the potential under the reset gate 20. Therefore, an output voltage (voltage applied to the reset drain 22) $V_{RD}$ of the SF circuit B is represented by the following Expression (7).

$$V_{RD}=\Phi_{max}(V_{GSF}) \quad (7)$$

Therefore, the above-mentioned Expressions (1) and (2) representing the state of a reset operation can be rewritten by the following Expressions (1)' and (2)'.

$$\Delta V_{max}=k(V_{GSF}-V\Phi_{RLow})-\Delta VF \quad (1)'$$

$$k(V\Phi_{RHigh}-V_{GSF})>0 \quad (2)'$$

wherein k=$\Delta\Phi_{max}/\Delta VG$

It is understood from Expressions (1)' and (2)' that if $V_{GSF}$, $V\Phi_{RLow}$, and $V\Phi_{RHigh}$ are set to be desired values by resistance-dividing, even when there is a variation in a potential under the reset gate 20, a reset operation (i.e., a signal output from a horizontal transfer gate 8 is cleared) of the FDA type charge detecting portion A can be performed in an optimum state at all times.

Furthermore, a voltage for resetting the floating diode 24 of the charge detecting portion A is an output voltage of the SF circuit B. This output voltage is always fixed to a stable DC level. Therefore, instability of a drain voltage which may occur in the case of a floating drain can be eliminated.

More specifically, stability of the DC level means sufficiently low impedance of a DC power source (voltage for resetting the floating diode 24, i.e., output voltage of the SF circuit B). According to the above-mentioned Japanese Laid-Open Publication No. 6-133227, a voltage for resetting has a structure of a floating drain. Therefore, impedance is high, and there is a possibility that an output voltage from the SF circuit B cannot be always maintained at a stable DC level, depending upon the level of a signal charge discharged by a reset operation.

In contrast, in Embodiment 1, a reset voltage is output from the SF circuit B so as to decrease impedance, whereby an output voltage from the SF circuit B can be reset to a stable DC level irrespective of the level of a signal charge.

Furthermore, in the case where there are variations in a power-supply voltage of the power source 50, since $V_{GSF}$ is generated by resistance-dividing a power-supply voltage, the variations in a power-supply voltage from the power source 50 vary the level of $V_{RD}$. However, in Embodiment 1, $V_{GSF}$ is commonly applied to the gate of the detecting transistor 51 of the SF circuit B and the gate of the transistor 52 for constant current load, so that the load current value is varied by the transistor 52 for constant current load, and variations in a level of $V_{RD}$ can be decreased.

In addition, in Embodiment 1, $V\Phi_{RLow}$ is also generated by resistance-dividing a power-supply voltage in the same way as in $V_{GSF}$. Therefore, in the case where a power-supply voltage is varied, the variation in ($V_{GSF}-V\Phi_{RLow}$) can be decreased.

FIG. 2 shows a relationship between the output voltage (voltage to be applied to the reset drain 22) $V_{RD}$ of the SF circuit B and the potential $\Phi_{max}$ ($V_G$=0 V) under the reset gate 20 when a reset gate voltage is 0 in the CTD 100 in Embodiment 1. As shown in FIG. 2, the variation in the potential $\Phi_{max}$ under the reset gate 20 is ±0.7 V (i.e., $\Phi_{max}$ ($V_G$=0 V)=8.9±0.7 V), and the variation of the power supply voltage (50 in FIG. 1) is ±0.5 V (i.e., 15.0±0.5 V). Thus, the relationship $\Delta\Phi_{max}/\Delta V_G$=0.8 can be assumed. If this relationship is assumed, a voltage applied to the reset drain has a variation of ±0.75 V.

FIG. 3 shows a relationship between $\Delta V_{max}$ and $\Phi_{max}$ ($V_G$=0 V), i.e., an example of reset operation characteristics. According to the CTD in Embodiment 1, under the condition shown in FIG. 2, as shown in FIG. 3, a reset operation and a sufficient signal $V_{max}$ ($\Delta V_{max} \geq 1.2$ V) can be ensured.

Herein, it will be described how the reset operation is ensured.

The reset operation needs to satisfy the above-mentioned relationship: $k(V\Phi_{RHigh}-V_{GSF})>0$ ... (2)'. In the case where k=0.8 and $\Delta VF$=0.75 in $\Delta V_{max}$=k($V_{GSF}-V\Phi_{RLow}$)$-\Delta VF$ ... (1)', the Expression (1)' becomes $\Delta V_{max}$=0.8 ($V_{GSF}-V\Phi_{RLow}$)$-0.75$. When the Expression (2)' is substituted into this Expression (1)', the Expression (1)' becomes $\Delta V_{max}$=0.8 ($V\Phi_{RHigh}-V\Phi_{RLow}$)$-0.75$. When ($V\Phi_{RHigh}-V\Phi_{RLow}$) is 3.3 V or less, the case where ($V\Phi_{RHigh}-V\Phi_{RLow}$) is 3.3 V or 3.0 V will be considered. In the case where ($V\Phi_{RHigh}-V\Phi_{RLow}$) is 3.3 V, $\Delta V_{max}$<1.89 (=0.8×3.3−0.75) V ... (3). In the case where ($V\Phi_{RHigh}-V\Phi_{RLow}$) is 3.0 V, $\Delta V_{max}$<1.65 (=0.8×3.0−0.75) V ... (4).

Considering the above-mentioned Expressions (3) and (4), it is understood that the conditions satisfying the reset operation shown in FIG. 3 (i.e., $\Delta V_{max} \leq 1.55$ V) allow the reset operation to be sufficiently ensured.

As described above, according to the structure in Embodiment 1, adjustment by an external circuit is not required for variations in the potential under the reset gate 20 and in an output voltage (voltage to be applied to the reset drain 22) $V_{RD}$, while 3.3 V driving of a reset pulse $\Phi_R$ can be realized.

Embodiment 2

Figure 4:
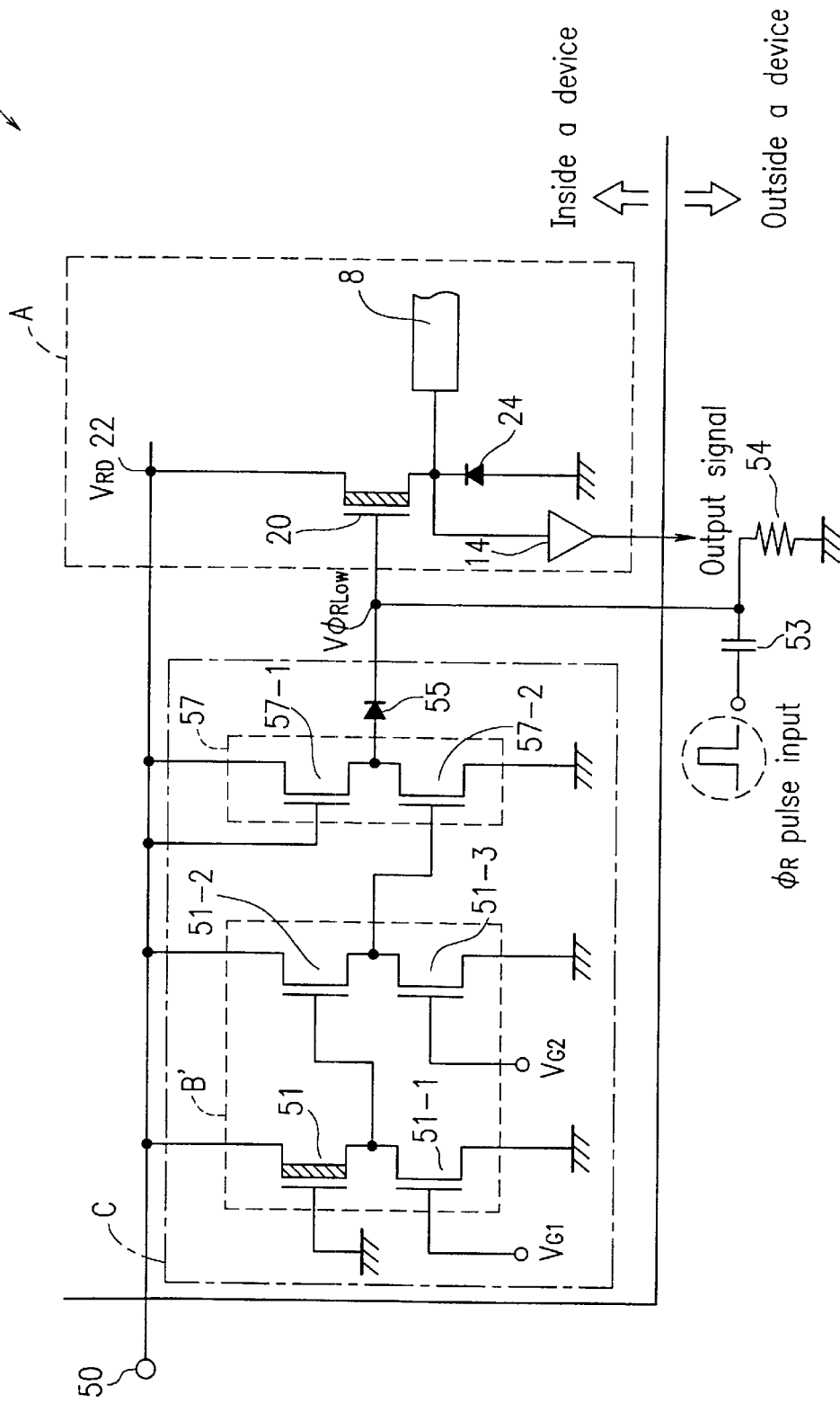
FIG. 4 is a circuit diagram showing a CTD in a second embodiment of the present invention.
Figure 5:
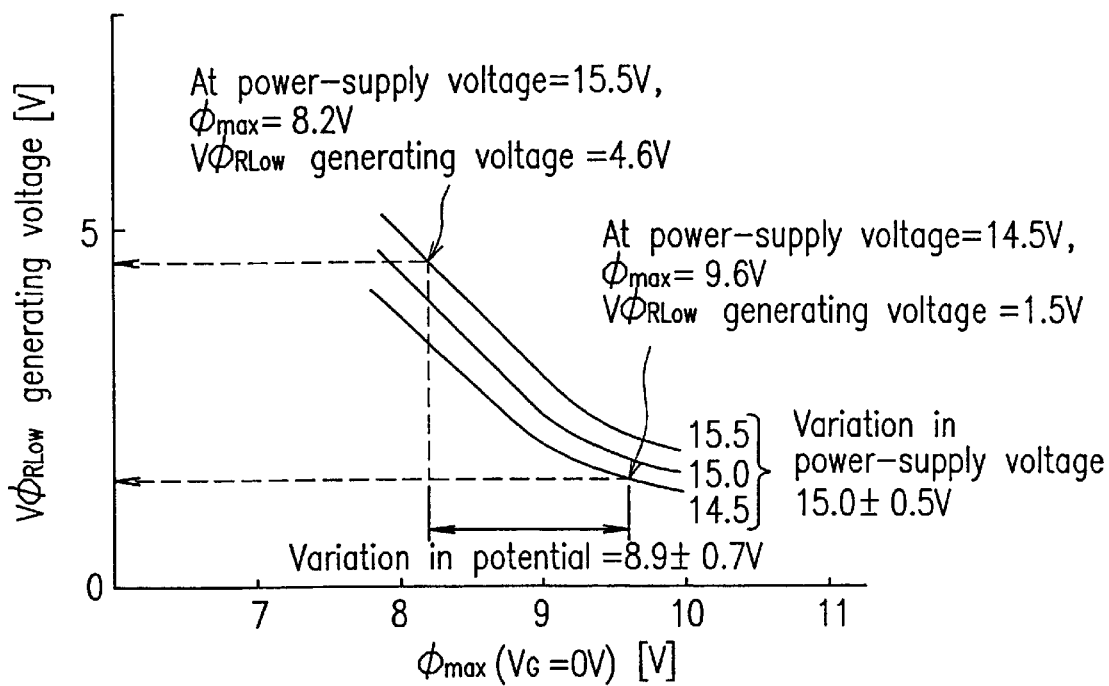
FIG. 5 is a graph showing the relationship between the $V\Phi_{RLow}$ generating voltage and $\Phi_{max}$ ($V_G$=0 V) in the CTD in the second embodiment of the present invention.
Figure 6:
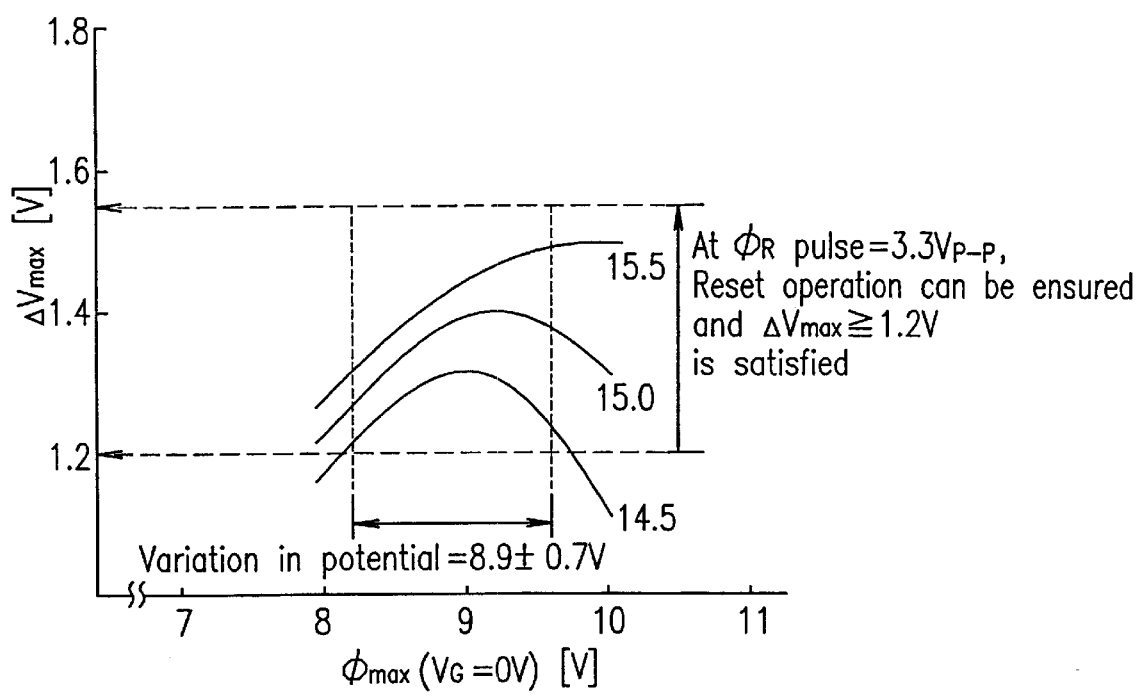
FIG. 6 is a graph showing an example of reset operation characteristics in the CTD in the second embodiment of the present invention.
Figure 7:
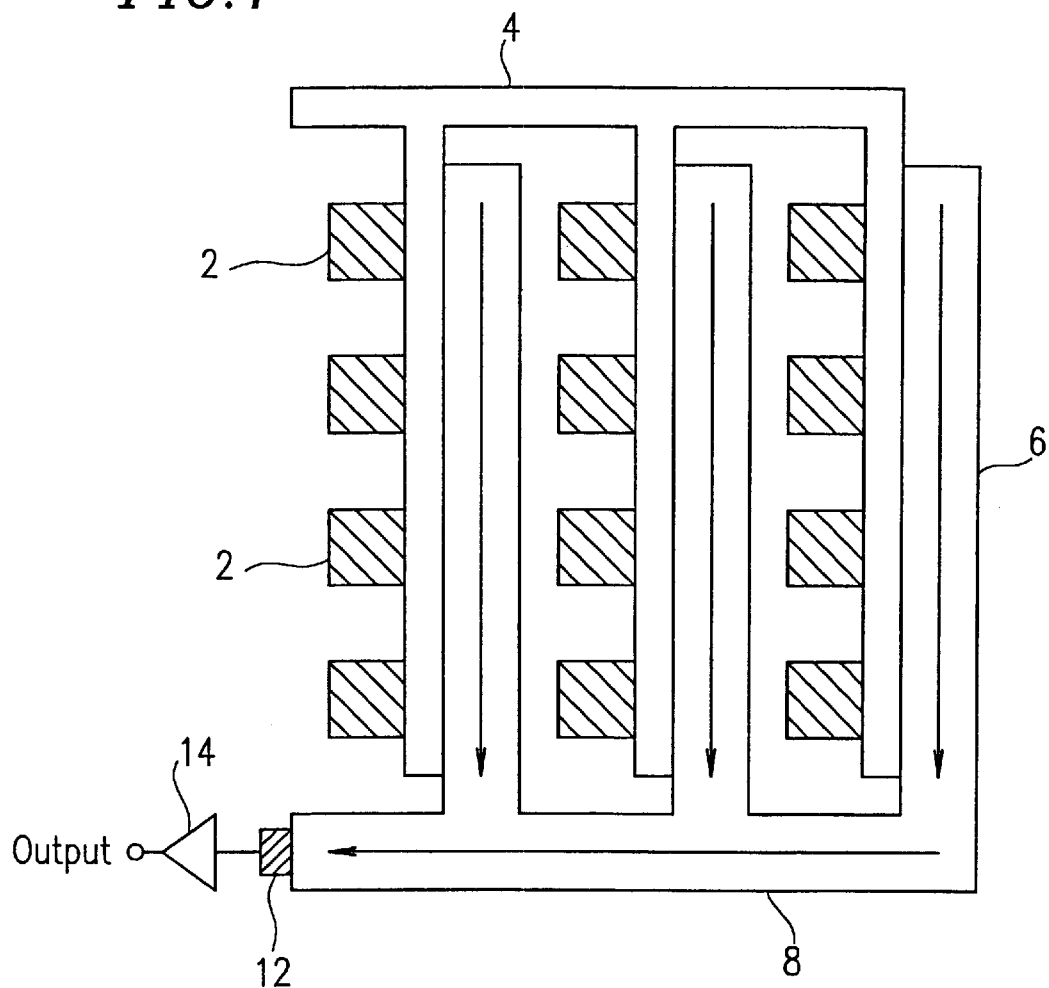
FIG. 7 is a diagram showing a two-dimensional image sensor.
Figure 8:
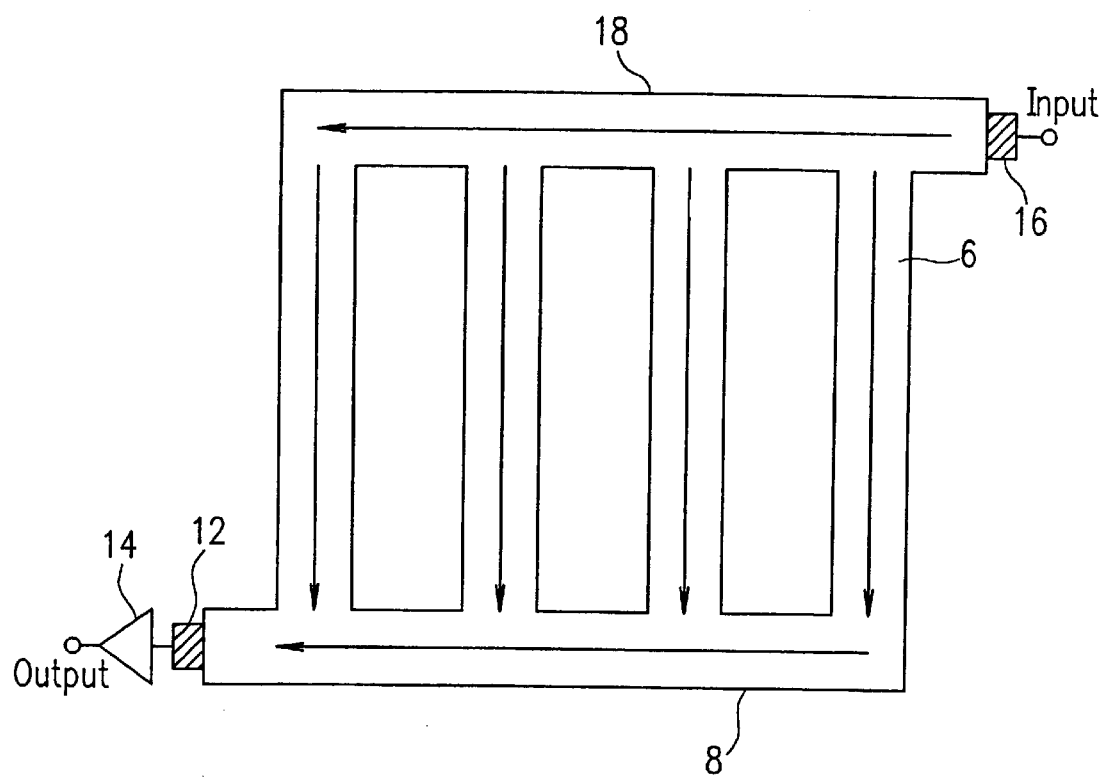
FIG. 8 is a diagram showing a delay device of a serial-parallel-serial system.

FIGS. 4 through 6 illustrate a CTD 200 in Embodiment 2 of the present invention. As shown in FIG. 4, the CTD 200 in Embodiment 2 also has an FDA type charge detecting portion A similar to that in Embodiment 1. Like reference numerals in FIGS. 4 through 6 refer to like parts in FIGS. 1 through 3.

As shown in FIG. 4, the CTD 200 in Embodiment 2 includes a floating diffusion amplifier type charge detecting portion A and a control circuit C having the same potential profile as that of a reset gate 20 of the charge detecting portion A. The control circuit C includes a source follower (SF) circuit B' including a detecting transistor 51 and an inverter circuit 57 having an input connected to an output of the SF circuit B'.

The SF circuit B' in Embodiment 2 may include transistors 51-1 to 51-3 in addition to the detecting transistor 51.

Furthermore, the inverter circuit 57 may include transistors 57-1 and 57-2. The number of transistors (51-1 to 51-3, 57-1 and 57-2) is not limited to that shown in FIG. 4. However, at least two transistors are required in the SF circuit B' including the detecting transistor and in the inverter circuit 57, respectively. In the SF circuit B' shown in FIG. 4, the transistors 51-2 and 51-3 are provided so as to achieve a predetermined operation point of the transistor 51-1. As long as the predetermined operation point can be achieved, the number of transistors is preferably small.

The transistor 51-1 operates in the same way as in the load transistor 52 in Embodiment 1. The transistors 51-2 and 51-3 are provided so as to achieve the predetermined operation point, as described above. The transistors 57-1 and 57-2 included in the inverter circuit 57 generate a voltage in a reverse direction to the potential fluctuation of the detecting transistor 51.

A power-supply voltage from a power source 50 of the SF circuit B' and the inverter circuit 57 is supplied to the reset drain 22 of the charge detecting portion A, and an output from the inverter circuit 57 is applied to a reset gate 20 of the charge detecting portion A. Moreover, a reset pulse $\Phi_R$ is given to the reset gate 20 of the charge detecting portion A via an external capacitor 53 and an external resistor 54 provided outside the device in the same manner as in Embodiment 1. An output from the inverter circuit 57 is applied to the reset gate 20 and becomes an offset voltage of the reset pulse $\Phi_R$. An output from the inverter circuit 57 may be applied to the reset gate 20 through the clamp circuit 55.

For example, in the case where a potential under the reset gate 20 is varied in a shallower direction, in order to normally perform a reset operation, the reset pulse $\Phi_R$ is required to be high. In the case where a potential under the reset gate 20 is varied in a deeper direction, it is required to lower the reset pulse $\Phi_R$.

In the CTD 200 in Embodiment 2, in the case where a potential under the reset gate 20 is varied, an output from the SF circuit B' is varied in accordance with a potential under the reset gate 20 in the same manner as in an output from the SF circuit B in Embodiment 1. In the CTD 200 in Embodiment 2, an output from the SF circuit B' is input to the inverter circuit 57, and an output from the inverter circuit 57 is varied in a reverse direction of the variation of a potential.

In Embodiment 2, as described above, an output from the inverter circuit 57 is prescribed to be an offset voltage of the reset pulse $\Phi_R$. As a result, in the CTD 200 in Embodiment 2, the reset pulse $\Phi_R$ due to the variation of a potential can be automatically optimized.

Furthermore, Embodiment 2 has the following advantage, compared with Embodiment 1. More specifically, in Embodiment 1, a reset drain voltage involved in the variation in a potential under the reset gate 20 is controlled, so that a reset level itself of the floating diode 24 is varied. As a result, an operation point of an amplifier 14 to be operated is varied after charge voltage conversion. The amplifier 14 performs impedance conversion, with a reset level (reset voltage) of the floating diode 24 being the maximum level of an input. In the case where the input level of the amplifier 14 is limited, it is required that the fluctuation in the input level is within an operation margin of the amplifier 14.

In Embodiment 2, a reset gate voltage of the reset gate 20 is controlled, so that an operation point of the amplifier 14 is not varied. Thus, Embodiment 2 is even more technically advantageous than Embodiment 1.

FIG. 5 shows a relationship between the $V\Phi_{RLow}$ generating voltage and the potential $\Phi_{max}$ ($V_G$=0 V) under the reset gate 20 when a reset gate voltage is 0 in the CTD 200 in Embodiment 2. The variation in the potential $\Phi_{max}$ under the reset gate 20 is ±0.7 V (i.e., $\Phi_{max}$($V_G$=0 V)=8.9±0.7 V), and the variation in the power supply voltage is ±0.5 V (i.e., 15.0±0.5 V). Thus, in the case where the relationship $\Delta\Phi_{max}/\Delta V_G$=0.8 is assumed, $V\Phi_{RLow}$ becomes 1.5 to 4.6 V.

FIG. 6 shows a relationship between $\Delta V_{max}$ and $\Phi_{max}$ ($V_G$=0 V), i.e., an example of reset operation characteristics. As shown in FIG. 6, a reset operation and a sufficient signal $V_{max}$ ($\Delta V_{max}$≧1.2 V) can be ensured with reset pulse $\Phi_R$=3.3 V amplitude under the condition shown in FIG. 5. More specifically, (1) a signal charge input from the horizontal transfer gate 8 can be discharged to a reset drain, (2) the amount of a signal input from the horizontal transfer gate 8 can be accumulated in the floating diode 24, and (3) even when there is a variation in various parameters, (1) and (2) are possible.

As described above, according to the structure in Embodiment 2, adjustment by an external circuit is not required for variations in the potential under the reset gate 20 and in the power-supply voltage $V_{RD}$, while 3.3 V driving of a reset pulse $\Phi_R$ can be realized.

As described above, in the CTD of the present invention, even when a potential under a reset gate of an FDA type charge detecting portion is varied, a reset operation can be always performed in an optimum state. Therefore, margins for variations in processing and a power-supply voltage, which have been maintained by obtaining a large reset gate amplitude in the past, are not required as a result of the present invention.

Thus, according to the present invention, a satisfactory reset operation, a decrease in a reset gate voltage, and non-adjustment of an offset voltage can be simultaneously achieved. Therefore, the number of components in systems made in accordance with the invention and the-power consumption thereof can be decreased.

Furthermore, in a CTD having a structure in which a reset gate voltage of a reset gate of an FDA type charge detecting portion is controlled, an operation point of an amplifier is not undesirably varied.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A charge transfer device, comprising:
   a floating diffusion amplifier type charge detecting portion containing a reset gate and a reset drain; and
   a source follower circuit including a detecting transistor having substantially the same potential profile as a potential profile of the reset gate of the charge detecting portion and a load transistor connected to the detecting transistor,
   wherein an output from the source follower circuit is supplied to the reset drain of the charge detecting portion,
   a first voltage, which is generated by resistance-dividing a power-supply voltage to be supplied to a drain of the source follower circuit, is commonly applied to each gate of the detecting transistor and the load transistor,
   a second voltage, which is generated by resistance-dividing the power-supply voltage, is applied to the reset gate of the charge detecting portion via a clamp circuit, whereby the charge transfer device is controlled in such a manner that a reset operation is always performed in an optimum state, irrespective of a variation in a potential under the reset gate.

2. A charge transfer device, comprising:

a charge detecting portion including a floating diffusion, a reset gate and a reset drain;

a control circuit including a source follower circuit and a resistance divider; and a pulse generating portion, wherein the source follower circuit includes a detecting transistor having substantially the same potential profile as a potential profile of the reset gate of the charge detecting portion and a load transistor connected between a source of the detecting transistor and a ground, and supplies its output to the reset gate together with a pulse generated by the pulse generating portion, and the resistance divider generates a first voltage and a second voltage by resistance-dividing a voltage supplied to a drain of the detecting transistor from a power source, supplies the first voltage commonly to gates of the detecting transistor and the load transistor, and supplies the second voltage to the reset gate.

3. A charge transfer device according to claim 2, wherein the control circuit further includes a clamp circuit, and the second voltage is supplied to the reset gate from the resistance divider via the clamp circuit.

* * * * *